(12) United States Patent
Kim

(10) Patent No.: US 6,351,057 B1
(45) Date of Patent: Feb. 26, 2002

(54) MICROACTUATOR AND METHOD FOR FABRICATING THE SAME

(75) Inventor: Il Kim, Kyungki-Do (KR)

(73) Assignee: Samsung Electro-Mechanics Co., LTD, Kyunglo-Do (KR)

( * ) Notice: Subject to any disclaimer, the term of this patent is extended or adjusted under 35 U.S.C. 154(b) by 0 days.

(21) Appl. No.: 09/452,553

(22) Filed: Dec. 1, 1999

(30) Foreign Application Priority Data

Jan. 25, 1999 (KR) .............................................. 99-2281

(51) Int. Cl.⁷ ................................................ H01L 41/04
(52) U.S. Cl. ....................................................... 310/365
(58) Field of Search ................................ 310/324, 365, 310/368, 370

(56) References Cited

U.S. PATENT DOCUMENTS

| | | | |
|---|---|---|---|
| 4,379,247 A | * 4/1983 | Mattuschka | 310/367 |
| 4,456,850 A | * 6/1984 | Inoue et al. | 310/324 |
| 4,642,508 A | * 2/1987 | Suzuki et al. | 310/321 |
| 4,680,595 A | * 7/1987 | Cruz-Uribe et al. | 347/40 |
| 5,126,615 A | * 6/1992 | Takeuchi et al. | 310/330 |
| 5,185,589 A | * 2/1993 | Krishnaswamy et al. | 333/133 |
| 5,210,455 A | * 5/1993 | Takeuchi et al. | 310/328 |
| 5,691,593 A | * 11/1997 | Takeuchi et al. | 310/328 |
| 5,692,279 A | * 12/1997 | Mang et al. | 29/25.35 |
| 5,873,153 A | * 2/1999 | Ruby et al. | 29/25.35 |
| 6,105,225 A | * 8/2000 | Torii et al. | 29/25.35 |

FOREIGN PATENT DOCUMENTS

| | | | |
|---|---|---|---|
| JP | 10-032454 | * | 2/1998 |
| JP | 10-181013 | * | 7/1998 |
| JP | 2000 211136 | * | 8/2000 |

* cited by examiner

*Primary Examiner*—Nestor Ramirez
*Assistant Examiner*—Peter Medley
(74) *Attorney, Agent, or Firm*—Darby & Darby

(57) ABSTRACT

Disclosed is a microactuator including a substrate, input lines adapted to apply a drive voltage and signals to an upper electrode, a lower electrode formed on an upper surface of the substrate, a piezoelectric element formed on an upper surface of the lower electrode, the piezoelectric element being provided, at a portion to be connected with the input lines, with at least one etched groove to have a gently inclined lateral surface at the portion, and the upper electrode formed over the piezoelectric element in such a fashion that it extends from an upper surface of the piezoelectric element to the gently inclined lateral surface, the upper electrode being connected to the input lines, whereby the connection between the upper electrode and the input lines is improved. Where the substrate is comprised of a metal substrate, the formation of the lower electrode can be eliminated. Since the piezoelectric element has a gently curved etched structure at one lateral end surface thereof, it is possible for the upper electrode to extend from the upper surface of the piezoelectric element to the substrate via the lateral end surface of the piezoelectric element. Accordingly, it is possible to increase the freedom of connection between the piezoelectric element and the input lines.

14 Claims, 6 Drawing Sheets

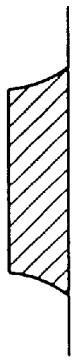  
Figure 5  Figure 6  Figure 7
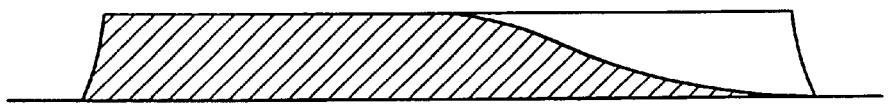
Figure 8

MICROACTUATOR AND METHOD FOR FABRICATING THE SAME

BACKGROUND OF THE INVENTION

1. Field of the Invention

The present invention relates to a microactuator and a method for fabricating the same, and more particularly to a microactuator having a piezoelectric element formed on a substrate to have a desired thickness and patterned using an etching process. The present invention also relates to a method for fabricating such a microactuator.

2. Description of the Prior Art

Typically, a microactuator includes a lower structure including a substrate and a chamber, a piezoelectric element attached to the upper surface of the substrate and adapted to generate a mechanical deformation thereof upon receiving a voltage, and an electrode (electrodes) adapted to transmit the voltage to the piezoelectric element.

In such an actuator having the above mentioned configuration, the piezoelectric element has a property exhibiting a poling phenomenon when an electrical field is applied thereto. In other words, the piezoelectric element exhibits an orientation when an electrical field is applied thereto. When a voltage is repeatedly applied across the piezoelectric element between upper and lower electrodes respectively formed at the upper and lower surfaces of the piezoelectric element, repeated mechanical deformation and recovery of the piezoelectric element occur, thereby causing the piezoelectric element to vibrate.

Since the actuator drives by virtue of an electrical field applied thereto, it is necessary to continuously apply a drive voltage to the actuator for such a driving of the actuator.

A variety of conventional methods are known in association with the manufacture of microactuators.

One method is a method in which a lower electrode is formed on a thin substrate patterned to have an accurate size. The resulting structure is then baked at a temperature of 1,200° C. Thereafter, a paste for formation of a piezoelectric element is formed over an exposed surface of the lower electrode, and then baked at a temperature of 1,000° C. or more, thereby forming a piezoelectric element. Subsequently, an upper electrode is formed on the piezoelectric element and then baked at a temperature of about 800° C. Thus, a microactuator is fabricated.

Another method is a method in which a piezoelectric sheet including a plurality of piezoelectric elements is prepared and then bonded to a metal substrate using a third material. In this case, the resulting piezoelectric plate is subjected to a machining process to simultaneously obtain a plurality of actuators each corresponding to one of the piezoelectric elements. Alternatively, a piezoelectric element machined to have a size corresponding to one actuator is bonded to a metal substrate, thereby obtaining an actuator.

Microactuators fabricated in the above mentioned methods have a cross-sectional structure having vertically extending lateral end surfaces. For this reason, the upper electrode for each actuator can be formed only on the upper surface of the piezoelectric element.

Meanwhile, for an application of a drive voltage or other signals to the actuator, input lines should be connected between the upper electrode and a circuit for supplying the drive voltage and other signals.

In order to connect such input lines to the upper electrode for an application of the drive voltage and other signals, a variety of connection methods have been used. For example, a wire bonding method has been used. Also, a method has been used in which input lines are directly connected to the upper electrode.

In accordance with the method in which input lines are connected to the upper electrode of the actuator using a wire bonding process, pads are formed at both the upper electrode and an insulating layer on a substrate, respectively. Wires are then bonded to the pads, respectively. For this reason, the process used is complex, resulting in a degradation in productivity. Moreover, wires, which are exposed, interfere with a process for coupling a printer head provided with the actuator with a cartridge. In severe cases, a part of such wires may be cut. Accordingly, there are problems of a degradation in reliability in terms of quality and a degradation in durability.

The method for directly connecting input lines to the upper electrode of the actuator is advantageous in that the connecting process is simple because it is unnecessary to form an insulating layer and pads for the connection of the input lines to the upper electrode. In this case, however, pressure and heat generated during the connection of the input lines to the upper electrode are directly applied to the piezoelectric element of the actuator, thereby causing the piezoelectric element to be changed in physical properties. As a result, the resulting product may be damaged.

The direct connection of the input lines to the upper electrode of the actuator may also have an adverse influence on a desired deformation of the actuator occurring in response to an application of a drive voltage to the upper electrode.

The above mentioned conventional methods exhibit a further degradation in productivity and quality in the case using an increased number of actuator cells.

In order to solve the above mentioned problems, the applicant has proposed a microactuator fabrication method which involves the steps of attaching a piezoelectric element having a desired thickness to the upper surface of a substrate, and patterning the piezoelectric element using an etching process, thereby forming a microactuator having a desired piezoelectric element pattern.

FIG. 1 schematically illustrates a method for forming a piezoelectric element using an etching process.

In accordance with the illustrated method, a metal substrate 10 is first prepared. A piezoelectric element 14 is then formed over the prepared substrate 10. The piezoelectric element 14 is then patterned using an etching process. Thereafter, an upper electrode 16 is formed on the patterned piezoelectric element 14.

FIG. 2 schematically illustrates a method for forming a piezoelectric element using an etching process.

In accordance with this method, a metal substrate 20 is first prepared. A lower electrode 22 is then formed over the prepared substrate 20. Thereafter, a piezoelectric element 24 is formed over the lower electrode 22. The piezoelectric element 24 is then patterned using an etching process. An upper electrode 26 is subsequently formed on the patterned piezoelectric element 24.

Where a microactuator is fabricated in accordance with the above mentioned method of FIG. 1 or 2 using an etching process, its piezoelectric element has a cross-sectional structure having, at its lateral ends, an inclined shape instead of a vertical shape. Accordingly, it is possible for the upper electrode to be formed not only on the upper surface of the piezoelectric element, but also on a lateral end surface of the piezoelectric element. In other words, the upper electrode formed on the upper surface of the piezoelectric element can extend to the substrate on which the piezoelectric element is formed.

Where the upper electrode exists not only the upper surface of the piezoelectric element, but also on a lateral end surface of the piezoelectric element, it is possible to connect input lines to the portion of the upper electrode disposed at the lateral end surface of the piezoelectric element. This allows for an easy connection of input lines to the actuator.

However, where the piezoelectric element is etched using a general etching pattern, it may have a non-uniform inclination along its etched lateral end surface. In particular, the piezoelectric element has a sharp inclination at a portion of its lateral end surface near the upper end thereof, so that it has a shape edge.

It is difficult to form an upper electrode on the sharp upper portion of the lateral end surface of the piezoelectric element. For this reason, it is easy for the short circuit to be partially cut at the lateral end surface of the piezoelectric element, as shown in FIG. 3. Thus, it is difficult for the upper electrode to extend completely from the upper surface of the piezoelectric element to the substrate.

SUMMARY OF THE INVENTION

The present invention has been made in view of the above mentioned problems, and an object of the invention is to provide a method for fabricating a microactuator, in which a groove is formed at a portion of one lateral end surface of a piezoelectric element where an upper electrode is to exist, thereby allowing the piezoelectric element has a gently inclined etched structure having a gradually decreasing height between the upper electrode and a substrate.

Another object of the invention is to provide an actuator fabricated in accordance with the above mentioned method.

In accordance with one aspect, the present invention provides a microactuator comprising: a substrate; input lines adapted to apply a drive voltage and signals to an upper electrode; a lower electrode formed on an upper surface of said substrate; a piezoelectric element formed on an upper surface of said lower electrode, said piezoelectric element being provided, at a portion to be connected with said input lines, with at least one etched groove to have a gently inclined lateral surface at said portion; and said upper electrode formed over said piezoelectric element in such a fashion that it extends from an upper surface of said piezoelectric element to said gently inclined lateral surface, said upper electrode being connected to said input lines; whereby said connection between said upper electrode and said input lines is improved.

In accordance with another aspect, the present invention provides a microactuator comprising: a metal substrate; input lines adapted to apply a drive voltage and signals to an upper electrode; a piezoelectric element formed on an upper surface of said metal substrate, said piezoelectric element being provided, at a portion to be connected with said input lines, with at least one etched groove to have a gently inclined lateral surface at said portion; and said upper electrode formed over said piezoelectric element in such a fashion that it extends from an upper surface of said piezoelectric element to said gently inclined lateral surface, said upper electrode being connected to said input lines; whereby said connection between said upper electrode and said input lines is improved.

In accordance with another aspect, the present invention provides a method for fabricating a microactuator comprising the steps of: preparing a substrate; forming a lower electrode on an upper surface of said substrate; forming a piezoelectric element on an upper surface of said lower electrode; etching a portion of said piezoelectric element corresponding to a region where said piezoelectric element is to be connected to said input liens, thereby forming a groove in such a fashion that said piezoelectric element has a gently inclined lateral surface at said portion; forming an upper electrode on said piezoelectric element in such a fashion that said upper electrode extends from an upper surface of said piezoelectric element to said gently inclined lateral surface of said piezoelectric element; and connecting input lines to said upper electrode; whereby said connection between said upper electrode and said input lines is improved.

In accordance with another aspect, the present invention provides a method for fabricating a microactuator comprising the steps of: preparing a metal substrate; forming a piezoelectric element on an upper surface of said piezoelectric element; etching a portion of said piezoelectric element corresponding to a region where said piezoelectric element is to be connected to said input liens, thereby forming a groove in such a fashion that said piezoelectric element has a gently inclined lateral surface at said portion; forming an upper electrode on said piezoelectric element in such a fashion that said upper electrode extends from an upper surface of said piezoelectric element to said gently inclined lateral surface of said piezoelectric element; and connecting input lines to said upper electrode; whereby said connection between said upper electrode and said input lines is improved.

BRIEF DESCRIPTION OF THE DRAWINGS

Other objects and aspects of the invention will become apparent from the following description of embodiments with reference to the accompanying drawings in which:

FIG. 5 is a cross-sectional view taken along the line A–A' of FIG. 4;

FIG. 6 is a cross-sectional view taken along the line B–B' of FIG. 4;

FIG. 7 is a cross-sectional view taken along the line C–C' of FIG. 4;

FIG. 8 is a cross-sectional view taken along the line D–D' of FIG. 4;

DESCRIPTION OF THE PREFERRED EMBODIMENTS

Figure 1:
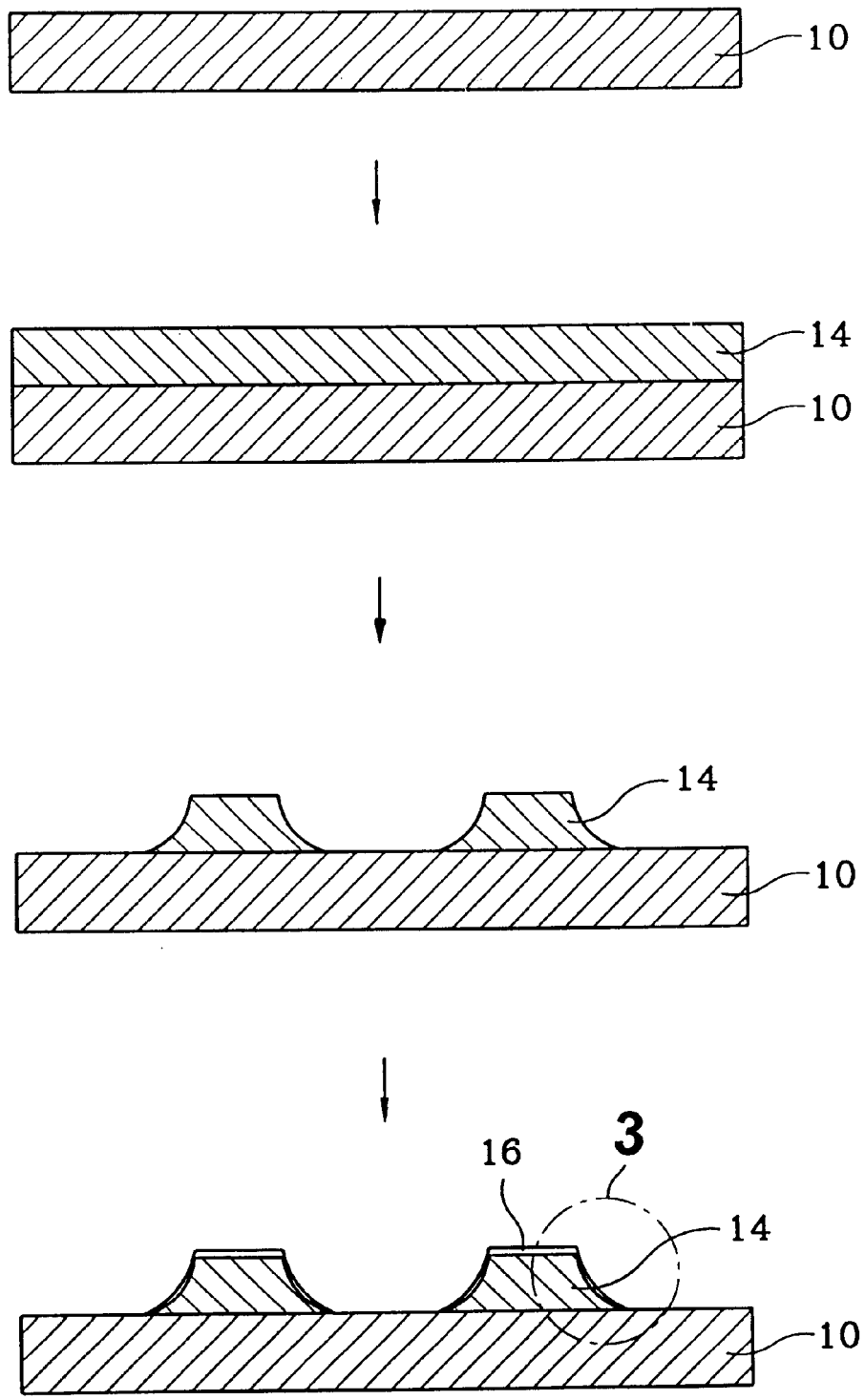
FIG. 1 is a cross-sectional view schematically illustrating sequential steps of a conventional method for fabricating an actuator using an etching process.
Figure 2:
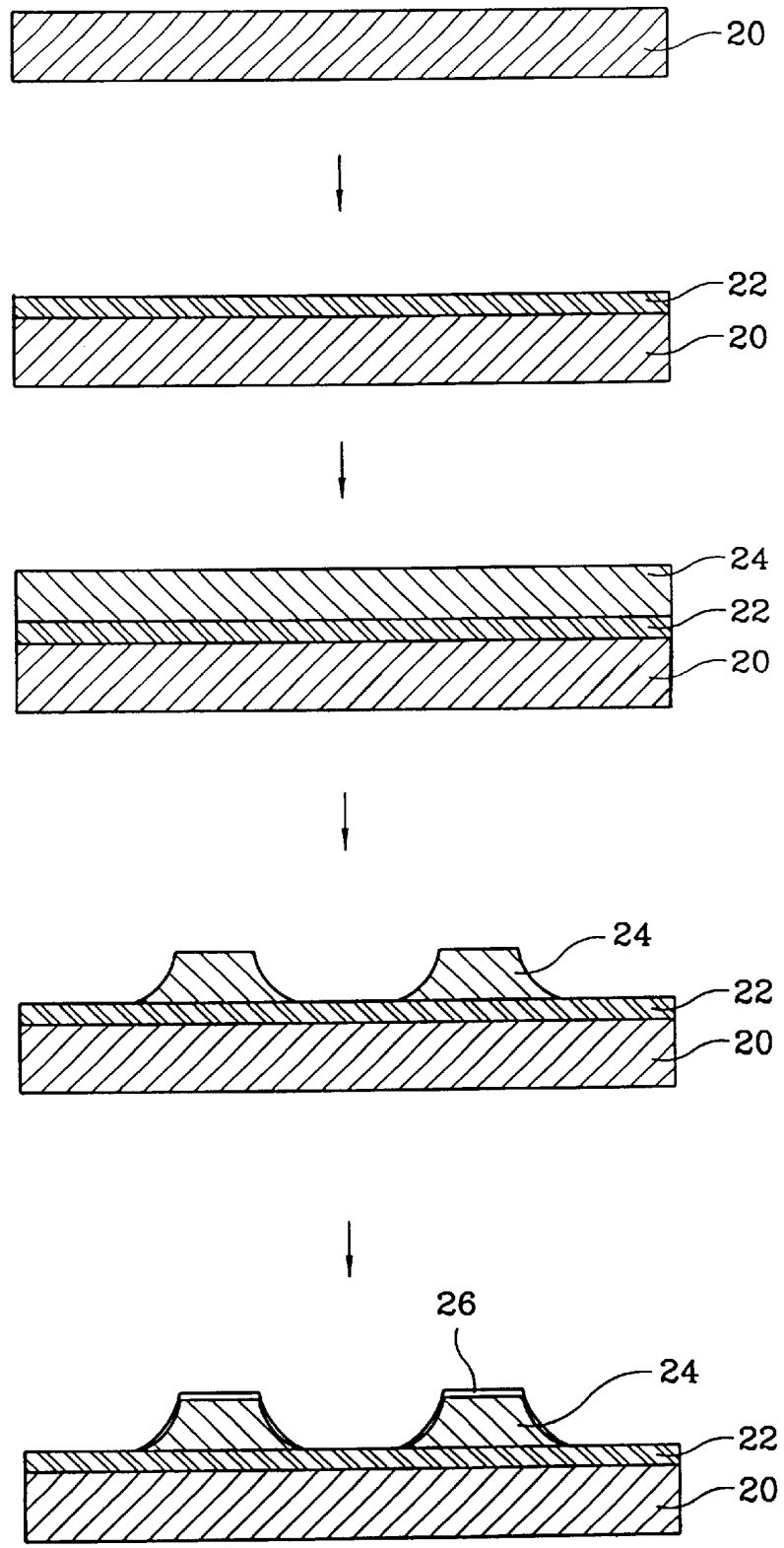
FIG. 2 is a cross-sectional view schematically illustrating sequential steps of another conventional method for fabricating an actuator using an etching process.
Figure 3:
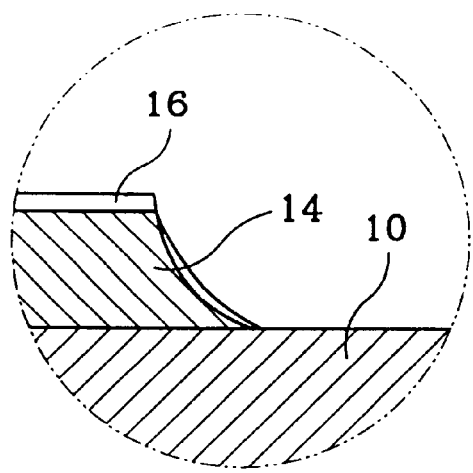
FIG. 3 is an enlarged view corresponding to a portion E of FIG. 1.

Now, a microactuator fabricated in accordance with an embodiment of the present invention will be described.

A microactuator according to an embodiment of the present invention includes a substrate. Preferably, this substrate comprises a thin metal substrate or a thin ceramic substrate.

The thin metal substrate is preferably made of a metal containing, as a principle component thereof, nickel (Ni), copper (Cu), chromium (Cr), or iron (Fe), or an alloy thereof.

Preferably, the thin metal substrate has a thickness of 3 to 200 µm.

The thin metal substrate is subjected to a wet etching process, a pressing process, or an electroforming process in order to have a desired structure at a desired portion thereof.

On the other hand, for the thin ceramic substrate, a variety of materials may be used. For example, zirconium oxide ($ZrO_2$), aluminum oxide ($Al_2O_3$), or silicon dioxide ($SiO_2$) may be used.

The thin ceramic substrate is formed by forming a green sheet using a slurry containing oxide powder selected from the above mentioned oxides, sintering the green sheet, and then shaping the sintered green sheet to have a desired substrate structure. Alternatively, the green sheet is shaped in a slurry state to have a desired substrate structure, and then sintered.

The thin ceramic substrate preferably has a thickness of 5 to 300 µm.

Where a thin metal substrate as mentioned above is used for the substrate of the microactuator, it is unnecessary to provide a lower electrode for the microactuator because the thin metal substrate can serve as the lower electrode in that it has a conductivity.

However, where a thin ceramic substrate as mentioned above is used for the substrate of the microactuator, it is essentially necessary to form a lower electrode on the substrate because the thin ceramic substrate has no conductivity.

The lower electrode is preferably made of platinum (Pt), silver (Ag), a silver/platinum (Ag/Pd) alloy, nickel (Ni), or copper (Cu). Preferably, the lower electrode has a thickness of 20 µm.

Where the lower electrode is in an exposed state during a step of forming an upper electrode in such fashion that the upper electrode extends to the substrate, as described hereinafter, it may overlap with the upper electrode. To this end, the lower electrode should be patterned in such a fashion that it is not exposed at a portion of the substrate corresponding to a region where the upper electrode is to be formed. Alternatively, an insulating layer is coated on a portion of the lower electrode exposed through a piezoelectric element formed on the substrate and partially etched, so as to prevent the lower and upper electrodes from coming into contact with each other.

The piezoelectric element is made of a ceramic material. The ceramic material of the piezoelectric element may include PZT ($Pb(ZrTi)O_3$), PLZT ($Pb_{1-x}La_x(ZrTi)O_3$), lead titanate ($PbTiO_3$), or barium titanate ($BaTiO_3$).

Preferably, the piezoelectric element has a thin plate shape having a thickness of 20 to 300 µm.

The piezoelectric element is bonded to the metal substrate or to the ceramic substrate formed with the lower electrode.

In order to allow the piezoelectric element to have superior actuating characteristics, the piezoelectric element should be firmly bonded to the metal substrate or to the lower electrode.

The piezoelectric element may be directly formed on the substrate. Alternatively, the piezoelectric element, which is separately prepared, may be attached to the substrate.

In order to directly form the piezoelectric element on the substrate, a screen printing method or the like may be used. The attachment of the separately prepared piezoelectric element to the substrate may be achieved using an attachment method using an adhesive or an attachment method using a metalizing process.

In accordance with the attachment method in which an adhesive is used to attach the separately prepared piezoelectric element to the substrate, the adhesive in a paste state is coated on the substrate or the piezoelectric element. Accordingly, the substrate and piezoelectric element are bonded together by means of the adhesive.

The adhesive may be coated over the entire portion of the substrate surface facing the piezoelectric element. Alternatively, the adhesive may be partially coated on a necessary surface portion of the substrate or piezoelectric element.

Where the adhesive may be coated over the entire portion of the substrate surface facing the piezoelectric element, it can serve as a protective film for protecting the substrate during an etching process for the piezoelectric element.

In accordance with the attachment method using the metalizing process to attach a separately prepared piezoelectric element to the substrate, a metal film is coated over one surface of the piezoelectric element. This metal film of the piezoelectric element is brazed to the metal substrate using a third material, that is, a brazing material.

This method, in which the piezoelectric element is attached to the substrate using the metalizing process, makes it possible to achieve an enhancement in the bonding strength of the piezoelectric element to the substrate, as compared to the attachment method using an adhesive. In accordance with this method, it is also possible to reduce the compliance of the actuator finally fabricated, thereby achieving an improvement in actuating characteristics.

After the formation of the piezoelectric element over the substrate, a patterning process is conducted to define an etching pattern for the piezoelectric element.

The patterning process may be carried out in accordance with a masking method using a shadow mask. Alternatively, a photoresist may be coated over the piezoelectric element. In the latter case, the photoresist film is then patterned in accordance with a photolithography process to form a desired etching pattern.

Figure 4:
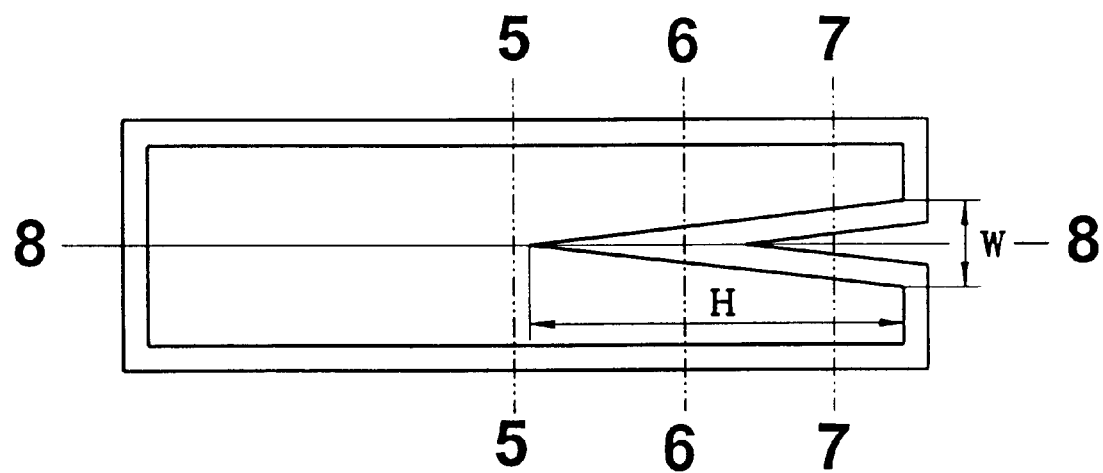
FIG. 4 is a plan view illustrating a state in which a piezoelectric element is etched using an etching pattern having a groove in accordance with an embodiment of the present invention.

In accordance with conventional methods, the etching pattern, which is used to pattern the piezoelectric element using an etching process, simply has a rectangular shape. In accordance with the present invention, however, the etching pattern has a rectangular shape while being provided with a groove at its portion corresponding to a region where the piezoelectric element is connected to input lines, as shown in FIG. 4. The groove has a tapered shape, namely, a triangular shape, increasing in width as it extends toward the lateral end of the piezoelectric element connected to input lines.

Assuming that "T" represents the thickness of the piezoelectric element, "W" represents the groove width at the base of the groove, that is, the groove width at the lateral end of the piezoelectric element connected to the input lines, and "H" represents the height of the groove, namely, the length of the groove extending laterally along the piezoelectric element, the width W and height H of the groove are preferably determined with respect to the thickness T of the piezoelectric element as follows:

$$T/20 < W < 10T$$

$$T/5 < H < 100T$$

The etching pattern may have two or more grooves each having the above mentioned structure. Where the etching pattern has two or more grooves, it is possible to obtain an increased freedom of connection between the piezoelectric element and the input lines.

The piezoelectric element is then etched using the etching pattern having the above mentioned shape. The etching is continuously carried out at a portion of the piezoelectric element corresponding to a larger-width portion of the etching pattern, so that a self-restricting reaction serving to stop the etching in accordance with a self-controlling reaction is slowly exhibited at that portion of the piezoelectric element. Accordingly, a deep and sharp etched structure is formed at the portion of the piezoelectric element corresponding to the large-width portion of the etching pattern. On the other hand, the self-restricting reaction is early exhibited at a portion of the piezoelectric element corresponding to a smaller-width portion of the etching pattern. Accordingly, the etching at the portion of the piezoelectric element corresponding to the smaller-width portion of the etching pattern is stopped after proceeding to a certain depth.

Since the portion of the piezoelectric element corresponding to the smaller-width portion of the etching pattern has a smaller etching width, the self-restraining reaction at that portion occurs earlier. This self-restraining reaction proceeds toward the portion of the piezoelectric element corresponding to the larger-width portion of the etching pattern because of a larger etching width at that portion, so that it occurs later at that portion. Thus, a gently inclined etched structure extending from the upper surface of the piezoelectric element to the substrate is formed.

Figure 12:
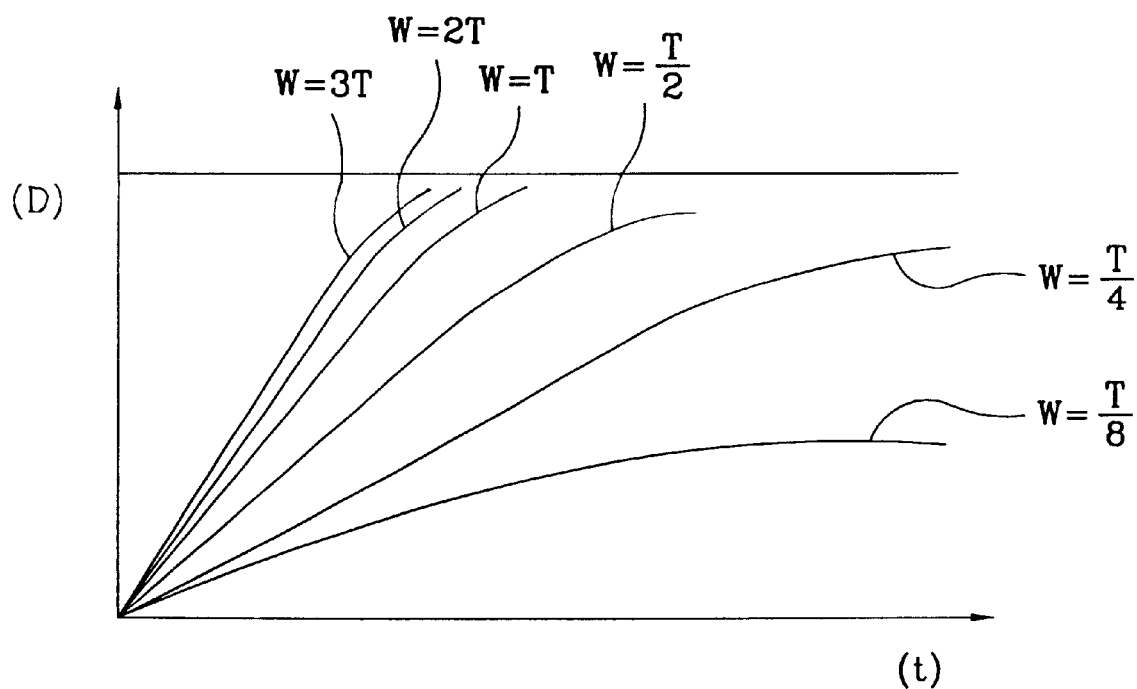
FIG. 12 is a graph depicting the relation between the etching time t and the etching depth D depending on the thickness T and groove width W of the piezoelectric element.

FIG. 12 is a graph depicting the relation between the etching time t and the etching depth D depending on the thickness T and groove width W of the piezoelectric element in the case in which the thickness T of the piezoelectric element is less than 50 μm.

Referring to FIG. 12, it can be found that an increased etching rate and an increased etched depth are exhibited at a greater groove width W.

An upper electrode having a desired pattern is formed on the piezoelectric element etched as mentioned above.

The upper electrode is typically made of silver (Ag), aluminum (Al), gold (Au), or platinum (Pt). For the formation of the electrode, a screen printing method may be used. Alternatively, a vacuum deposition method may be used. In the latter case, the piezoelectric element is appropriately masked using a shadow mask.

In accordance with conventional methods, the upper electrode, which is adapted to be connected with input lines in order to allow the actuator to be applied with a drive voltage and other signals, is formed only on the upper surface of the piezoelectric element. In accordance with the present invention, however, the upper electrode is formed in such a fashion that it extends from the upper surface of the piezoelectric element to the substrate via one lateral end surface of the piezoelectric element.

The upper electrode, which extends from the upper surface of the piezoelectric element to the substrate via the lateral end surface of the piezoelectric element, is connected to input lines so that it is applied with a drive voltage and other signals.

Since the piezoelectric element has a gently curved etched structure at one lateral end surface thereof in accordance with the present invention, it is possible for the upper electrode to extend from the upper surface of the piezoelectric element to the substrate via the lateral end surface of the piezoelectric element. Since the upper electrode extends to the substrate, it is possible to increase the freedom of connection between the piezoelectric element and the input lines.

Also, the method of the present invention provides effects of a simplified fabrication and an increased reliability, as compared to conventional methods.

FIG. 4 is a plan view illustrating the state in which the piezoelectric element is formed with a triangular groove at one lateral portion thereof in accordance with the present invention. FIG. 5 is a cross-sectional view taken along the line A–A' of FIG. 4. FIG. 6 is a cross-sectional view taken along the line B–B' of FIG. 4. FIG. 7 is a cross-sectional view taken along the line C–C' of FIG. 4. FIG. 8 is a cross-sectional view taken along the line D–D' of FIG. 4. Referring to FIGS. 5 to 8, it can be found that the piezoelectric element has a gently inclined structure at a portion thereof where the triangular groove is formed.

Figure 9:
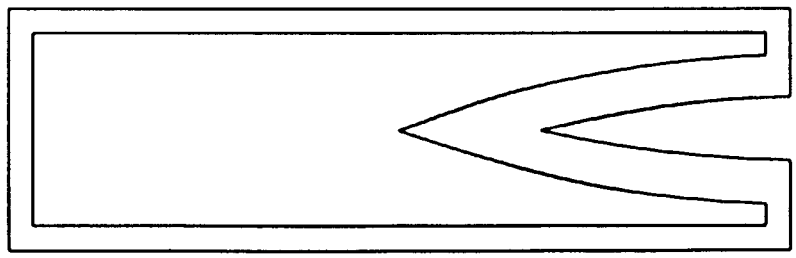
FIGS. 9 and 10 are plan views respectively illustrating grooves of different shapes formed at one lateral portion of a piezoelectric element in accordance with different embodiments of the present invention.
Figure 10:
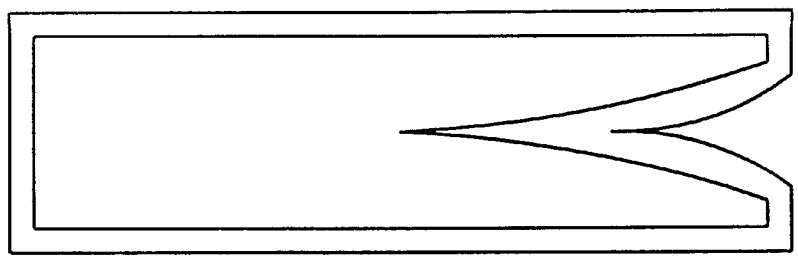
Figure 11:
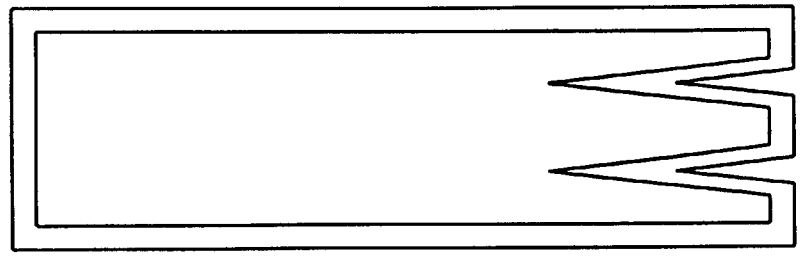
FIG. 11 is a plan view illustrating an embodiment of the present invention in which two grooves are formed at the lateral portion of a piezoelectric element to be connected with inlet lines.

FIGS. 9 and 10 illustrates grooves of different shapes formed at one lateral portion of the piezoelectric element in accordance with different embodiments of the present invention, respectively. Also, FIG. 11 illustrates an embodiment of the present invention in which two grooves are formed at the lateral portion of the piezoelectric element to be connected with inlet lines.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A microactuator comprising:

a substrate;

input lines adapted to apply a drive voltage and signals to an upper electrode;

a lower electrode formed on an upper surface of said substrate;

a piezoelectric element formed on a n upper surface of said lower electrode, said piezoelectric element being provided, at a portion to be connected with said input lines, with at least one etched groove to have a gently inclined lateral surface at said portion; and said upper electrode formed over said piezoelectric element in such a fashion that it extends from an upper surface of said piezoelectric element to said gently inclined lateral surface, said upper electrode being connected to said input lines;

whereby said connection between said upper electrode and said input lines is improved;

further comprising:

an insulating layer formed on a portion of said lower electrode exposed an etched portion of said piezoelectric element.

2. The microactuator in accordance with claim 1, wherein said groove of said piezoelectric element has a width and a height determined as follows:

$$T/20 < W < 10T$$

$T/5<H<100T$ where, "T" represents a thickness of said piezoelectric element, "W" represents a width of said groove at a lateral end of said piezoelectric element connected to said input lines, and "H" represents a height of said groove, namely, a length of said groove extending laterally along said piezoelectric element.

3. The microactuator in accordance with claim 1, wherein said substrate is made of ceramic.

4. The microactuator in accordance with claim 1, wherein said piezoelectric element has at least two etched grooves.

5. A microactuator comprising:

a substrate;

input lines adapted to apply a drive voltage and signals to an upper electrode;

a lower electrode formed on an upper surface of said substrate;

a piezoelectric element formed on a n upper surface of said lower electrode, said piezoelectric element being provided, at a portion to be connected with said input lines, with at least one etched groove to have a gently inclined lateral surface at said portion; and said upper electrode formed over said piezoelectric element in such a fashion that it extends from an upper surface of said piezoelectric element to said gently inclined lateral surface, said upper electrode being connected to said input lines;

whereby said connection between said upper electrode and said input lines is improved;

further comprising:

an insulating layer formed on a portion of said lower electrode exposed an etched portion of said piezoelectric element.

6. The microactuator in accordance with claim 5, wherein said piezoelectric element has at least two etched grooves.

7. The microactuator in accordance with claim 5, wherein said groove of said piezoelectric element has a width and a height determined as follows:

$T/20<W<10T$ $T/5<H<100T$ where, "T" represents a thickness of said piezoelectric element, "W" represents a width of said groove at a lateral end of said piezoelectric element connected to said input lines, and "H" represents a height of said groove, namely, a length of said groove extending laterally along said piezoelectric element.

8. The microactuator in accordance with claim 5, wherein said substrate is made of ceramic.

9. A microactuator comprising:

a metal substrate;

input lines adapted to apply a drive voltage and signals to an upper electrode;

a piezoelectric element formed on an upper surface of said metal substrate, said piezoelectric element being provided, at a portion to be connected with said input lines, with at least one etched groove to have a gently inclined lateral surface at said portions; and said upper electrode formed over said piezoelectric element in such a fashion that it extends from an upper surface of said piezoelectric element to said gently inclined lateral surface, said upper electrode being connected to said input lines;

whereby said connection between said upper electrode and said input lines is improved;

wherein said lower electrode is not exposed at a portion of said substrate where said upper electrode is formed.

10. The microactuator in accordance with claim 9, wherein said groove of said piezoelectric element has a width and a height determined as follows:

$T/20<W<10T$ $T/5<H<100T$ where, "T" represents a thickness of said piezoelectric element, "W" represents a width of said groove at a lateral end of said piezoelectric element connected to said input lines, and "H" represents a height of said groove, namely, a length of said groove extending laterally along said piezoelectric element.

11. The microactuator in accordance with claim 9, wherein said piezoelectric element has at least two etched grooves.

12. A microactuator comprising:

a metal substrate;

input lines adapted to apply a drive voltage and signals to an upper electrode;

a piezoelectric element formed on an upper surface of said metal substrate, said piezoelectric element being provided, at a portion to be connected with said input lines, with at least one etched groove to have a gently inclined lateral surface at said portions; and said upper electrode formed over said piezoelectric element in such a fashion that it extends from an upper surface of said piezoelectric element to said gently inclined lateral surface, said upper electrode being connected to said input lines;

whereby said connection between said upper electrode and said input lines is improved;

further comprising:

an insulating layer formed on a portion of said lower electrode exposed through an etched portion of said piezoelectric element.

13. The microactuator in accordance with claim 12, wherein said piezoelectric element has at least two etched grooves.

14. The microactuator in accordance with claim 12, wherein said groove of said piezoelectric element has a width and a height determined as follows:

$T/20<W<10T$ $T/5<H<100T$ where, "T" represents a thickness of said piezoelectric element, "W" represents a width of said groove at a lateral end of said piezoelectric element connected to said input lines, and "H" represents a height of said groove, namely, a length of said groove extending laterally along said piezoelectric element.

* * * * *